United States Patent [19]

Matsui

[11] Patent Number: 5,686,862
[45] Date of Patent: Nov. 11, 1997

[54] FM DEMODULATOR INTEGRATED ON SEMICONDUCTOR CHIP WITHOUT DISCRETE CIRCUIT COMPONENTS

[75] Inventor: Toshiya Matsui, Tokyo, Japan

[73] Assignee: NEC Corporation, Tokyo, Japan

[21] Appl. No.: 655,939

[22] Filed: May 31, 1996

[30] Foreign Application Priority Data

May 31, 1995 [JP] Japan .................... 7-133966

[51] Int. Cl.⁶ .................... H03D 3/02; H03D 3/28
[52] U.S. Cl. .................... 329/318; 329/325; 329/326; 331/113 R; 455/214; 348/726
[58] Field of Search .................... 329/318, 325, 329/326; 331/113 R; 348/726; 455/214

[56] References Cited

U.S. PATENT DOCUMENTS

| 4,479,091 | 10/1984 | Yoshisato | 329/326 |
| 4,881,042 | 11/1989 | Min et al. | 329/326 |

*Primary Examiner*—Siegfried H. Grimm
*Attorney, Agent, or Firm*—Sughrue, Mion, Zinn, Macpeak & Seas, PLLC

[57] ABSTRACT

An FM demodulator formed on a semiconductor chip generates a demodulated audio-frequency signal from an audio intermediate frequency signal through a phase locked loop constituted by a multiplier, a low-pass filter and a voltage-controlled oscillator. A variation of amplitude of the demodulated audio-frequency signal due to a temperature variation is compensated by a temperature compensating amplifier and a de-emphasis filter through first and second reference currents flowing out therefrom through an internal resistor fabricated on the same semiconductor chip and an external resistor.

3 Claims, 8 Drawing Sheets

1

FM DEMODULATOR INTEGRATED ON SEMICONDUCTOR CHIP WITHOUT DISCRETE CIRCUIT COMPONENTS

FIELD OF THE INVENTION

This invention relates to an FM (Frequency Modulation) demodulator and, more particularly, to an FM demodulator available for an aural signal supplied to a television and an FM tuner.

DESCRIPTION OF THE RELATED ART

According to the Japanese Television Standards, the carrier frequency of an audio signal is 54.25 MHz, and the carrier frequency of a video signal is 58.75 MHz. The video signal and the audio signal are subjected to the AM (Amplitude Modulation) modulation and the FM modulation, respectively.

An actual television receiver firstly converts the audio signal to an audio intermediate frequency signal on the carrier frequency of 4.5 MHz, which is equal to the difference between the carrier frequency of the audio signal and the carrier frequency of the video signal, and the audio intermediate signal is demodulated.

The Japanese Television Standards only allow an FM modulated signal to vary the frequency between +25 KHz and −25 KHz at 100 percent modulation, and the maximum frequency variation is extremely small with respect to the frequency of the audio intermediate frequency signal at 4.5 MHz. When demodulating the FM modulated signal, an FM demodulator of the type having a standard PLL (Phase-Locked Loop) circuit may be used, and an oscillator such as a multivibrator is usually incorporated in the PLL circuit. If the oscillator widely varies the frequency and the PLL circuit is too sensitive to the feedback control, the FM demodulator varies the amplitude of the demodulated signal over the allowed amplitude range. For this reason, the audio signal is demodulated by using a quadrature FM demodulation system or an FM demodulator including an oscillator of the type having coils.

FIG. 1 illustrates a typical example of the signal processing circuit 1 incorporated in a television receiver. The prior art signal processing circuit comprises a tuner 1a connected to a receiving antenna 2. Television broadcasting signals are caught by the receiving antenna 2, and the received signals are transferred from the antenna 2 to the tuner 1a. The tuner 1a selects one of the received signals, and extracts visual information and aural information from the received signal. The tuner 1a generates a video intermediate frequency signal and an audio intermediate frequency signal from the received signal. The video intermediate frequency signal is representative of the visual information, and the carrier frequency is regulated to 58.75 MHz. On the other hand, the audio intermediate frequency signal is representative of the aural information, and the carrier frequency is regulated to 54.25 MHz.

The prior art signal processing circuit 1 further comprises saw filters 1b and 1c connected to the tuner 1a, amplifiers 1d and 1e connected to the saw filters 1b and 1c, respectively, a demodulator 1f connected to the amplifier 1d and a mixer 1g connected to the amplifier 1e and the demodulator 1f. The saw filters 1b and 1c eliminate noise frequency components from the video intermediate frequency signal and the audio intermediate frequency signal, and supply the video intermediate frequency signal and the audio intermediate frequency signal to the amplifiers 1d and 1e, respectively. The amplifiers 1d and 1e respectively magnify the video intermediate frequency signal and the audio intermediate frequency signal, and, thereafter, supply the video intermediate frequency signal and the audio intermediate frequency signal to the demodulator 1f and the mixer 1g, respectively. The demodulator 1f generates a video demodulation signal and a video carrier signal CV from the video intermediate frequency signal through the AM demodulation, and supplies the video carrier signal CV to the mixer 1g. The mixer 1g carries out a multiplication between the audio intermediate frequency signal at 54.25 MHz and the video carrier signal CV at 58.75 MHz, and generates a mixing signal between a first frequency signal representative of the frequency sum at 113 MHz and a second frequency signal representative of the frequency difference at 4.5 MHz.

The prior art signal processing circuit 1 further comprises a band-pass filter 1h connected to the mixer 1g, a limiter 1i connected to the band-pass filter 1h, an FM demodulator 1j connected to the limiter 1i and a de-emphasis filter 1k connected to the FM demodulator 1j. The mixer 1g supplies the mixing signal to the band-pass filter 1h, and the band-pass filter 1h extracts the second frequency signal representative of the frequency difference at 4.5 MHz from the mixing signal. The band-pass filter 1h supplies a band-pass intermediate frequency signal representative of the extracted frequency difference to the limiter 1i. The limiter 1i amplifies and limits the amplitude so as to previously eliminate influences of AM components from the FM demodulation. The limiter 1i supplies an audio intermediate frequency signal AIF to the FM demodulator 1j. The FM demodulator 1j demodulates the audio intermediate frequency signal AIF, and supplies a demodulated audio-frequency signal DAF to the de-emphasis filter 1k. The de-emphasis filter 1k carries out the de-emphasis on the demodulated audio-frequency signal DAF, and improves the signal-to-noise ratio of an audio-frequency signal AF.

Capacitors fabricated on a semiconductor chip are available for the de-emphasis filter 1k, and the de-emphasis filter is integrated on the semiconductor chip.

Various circuit configurations of the FM demodulator are known to a person skilled in the art, and FIGS. 2 and 3 illustrate the circuit configuration of the FM demodulator using the quadrature technology and another circuit configuration of the FM demodulator of the type having a PLL circuit, respectively.

The quadrature FM demodulator comprises a phase shifter 3a and a multiplier 3b. The phase shifter 3a is usually implemented by using induction coils or ceramic filters. The audio intermediate frequency signal AIF is supplied to both of the phase shifter 3a and the multiplier 3b. The phase shifter 3a shifts the phase of the audio intermediate frequency signal just regulated to 4.5 MHz by 90 degrees, and varies the amount of phase-shift depending upon the frequency deviation from 4.5 MHz. The phase-shifted audio intermediate frequency signal AIF' is supplied from the phase shifter 3a to the multiplier 3b, and the multiplier 3b generates the demodulated audio frequency signal DAF through the multiplication between the audio intermediate frequency signal AIF and the phase-shifted audio intermediate frequency signal AIF'.

On the other hand, the FM demodulator of the type having the PLL circuit comprises a multiplier 4a, a low-pass filter 4b and a voltage-controlled oscillator 4c abbreviated as "VCO", and an LC filter 4d is incorporated in the voltage-controlled oscillator 4c. The multiplier 4a, the low-pass filter 4b and the voltage controlled oscillator 4c form the PLL circuit, and the audio intermediate frequency signal AIF is supplied to the multiplier 4a. The multiplier 4a multiplies the audio intermediate frequency signal AIF by the oscillating signal SO supplied from the voltage controlled oscillator 4c, and supplies a product signal PS to the low-pass filter 4b. The low-pass filter 4b eliminates high-frequency components from the product signal PS, and generates the demodulated audio-frequency signal DAF. The demodulated audio-frequency signal DAF is not only output from the FM demodulator 1j but also supplied to the voltage-controlled oscillator 4c. The demodulated audio-frequency signal DAF is used for the frequency control in the voltage-controlled oscillator 4c. The LC filter 4d forms a feedback loop, and is tuned to the center frequency of the oscillating signal SO so as to provide a reference frequency signal to the voltage-controlled oscillator 4c. The voltage-controlled oscillator 4c oscillates at the frequency tuned to the audio intermediate frequency signal AIF.

Semiconductor integrated circuit devices and several discrete circuit components form the prior art signal processing circuit. However, the discrete circuit components increase the production cost of the prior art signal processing circuit, and a manufacturer tries to integrate the discrete circuit components with the other circuits already integrated on a semiconductor chip. As described hereinbefore, the de-emphasis filter has been already integrated on a semiconductor chip. However, the prior art FM demodulator of the type having the PLL circuit is hardly integrated on a semiconductor chip without a discrete circuit component. Although the manufacturer can realize an unstable multivibrator of the PLL circuit on a semiconductor chip by using capacitors and resistors fabricated thereon, the capacitors and the resistors on the semiconductor chip are so sensitive to temperature variation that the prior art signal processing circuit can not satisfy the Japanese Television Standards, which only allow the FM modulation to vary the center frequency at 4.5 MHz between +25 KHz and −25 KHz as described hereinbefore. This means that the prior art FM demodulator requires a temperature compensating circuit implemented by discrete circuit components.

Thus, the prior art signal processing circuit requires discrete circuit components. The discrete circuit components enlarge the occupation space, lower the reliability and increase the production cost.

SUMMARY OF THE INVENTION

It is therefore an important object of the present invention to provide an FM demodulator which is stable against temperature variation without a large number of discrete circuit components.

In accordance with the present invention, there is provided an FM demodulator connected to a de-emphasis filter supplied with a power current and carrying out a de-emphasis for generating an audio-frequency signal, comprising: a multiplier for multiplying an audio intermediate frequency signal by an oscillating signal for producing a first output signal representative of a product of the multiplication; a low-pass filter connected to the multiplier, and eliminating high-frequency components from the first output signal for producing a demodulated audio-frequency signal; a voltage controlled oscillator connected to the low-pass filter, and responsive to the demodulated audio-frequency signal for controlling a frequency of the oscillating signal, the voltage controlled oscillator having a first resistor and a first capacitor both fabricated on a semiconductor chip and forming parts of a time constant circuit of an astable multivibrator for determining a fundamental frequency of the oscillating signal; and a temperature compensating amplifier connected to the low-pass filter, and amplifying the demodulated audio-frequency signal for generating a second output signal supplied to the de-emphasis filter, the temperature compensating amplifier generating a first reference current passing through a second resistor fabricated on the semiconductor chip and a second reference current passing through a third resistor implemented by a discrete component outside of the semiconductor chip so as to suppress a variation of an amplitude of the demodulated audio-frequency signal due to temperature dependency characteristics of the time constant circuit.

BRIEF DESCRIPTION OF THE DRAWINGS

The features and advantages of the FM modulator according to the present invention will be more clearly understood from the following description taken in conjunction with the accompanying drawings in which.

DESCRIPTION OF THE PREFERRED EMBODIMENT

Figure 4:
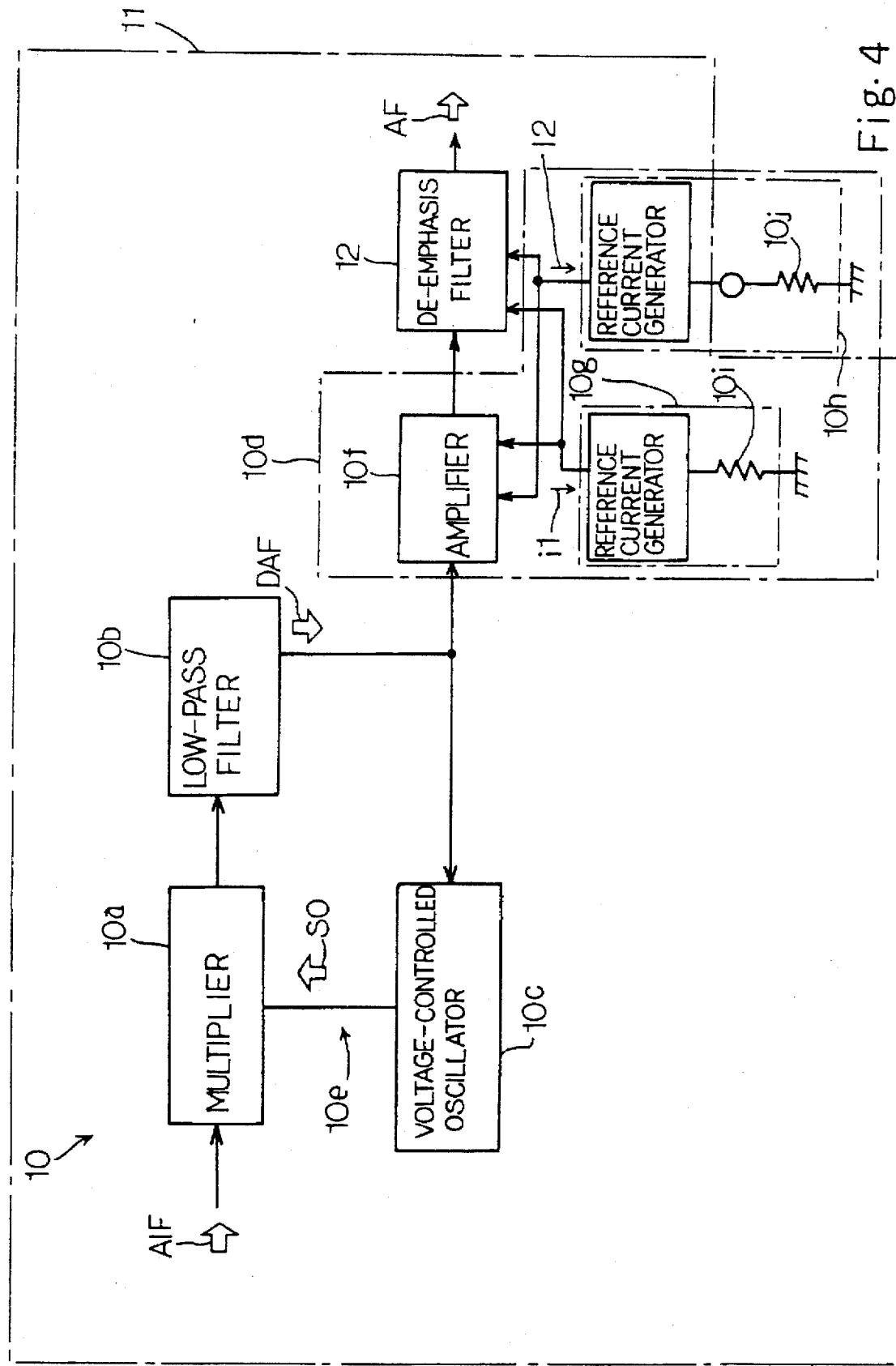
FIG. 4 is a block diagram showing an FM demodulator according to the present invention.

Referring to FIG. 4 of the drawings, an FM demodulator 10 embodying the present invention largely comprises a multiplier 10a, a low-pass filter 10b, a voltage-controlled oscillator 10c and a temperature compensating amplifier 10d. The FM demodulator 10 and a de-emphasis filter 12 are integrated on a semiconductor chip 11, and forms a signal processing circuit for a television receiver together with the tuner 1a, the saw filters 1b/1c, the amplifiers 1d/1e, the AM demodulator 1f, the mixer 1g, the band-pass filter 1h and the limiter 1i. One or more than one circuits may be integrated on the semiconductor chip together with the FM demodulator 10 and the de-emphasis filter 12.

Figure 1:
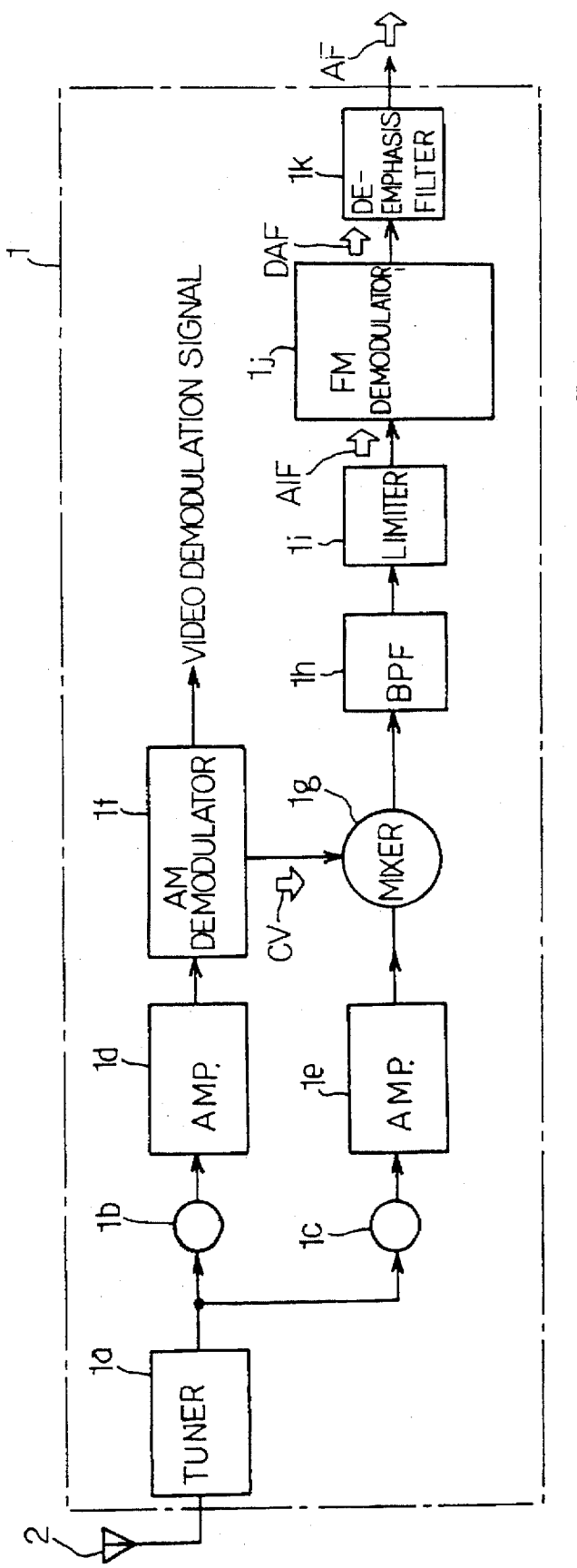
FIG. 1 is a block diagram showing the prior art signal processing circuit.
Figure 2:
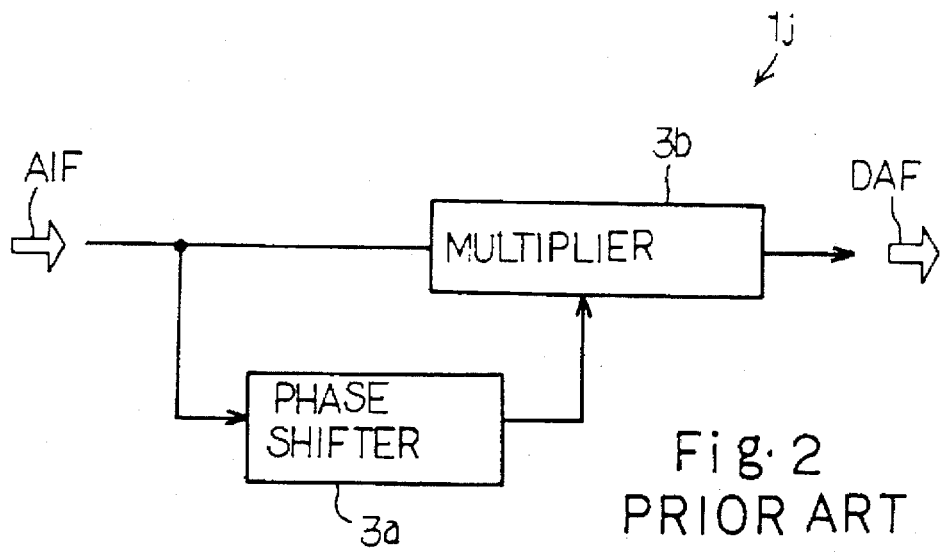
FIG. 2 is a block diagram showing the prior art FM demodulator.
Figure 3:
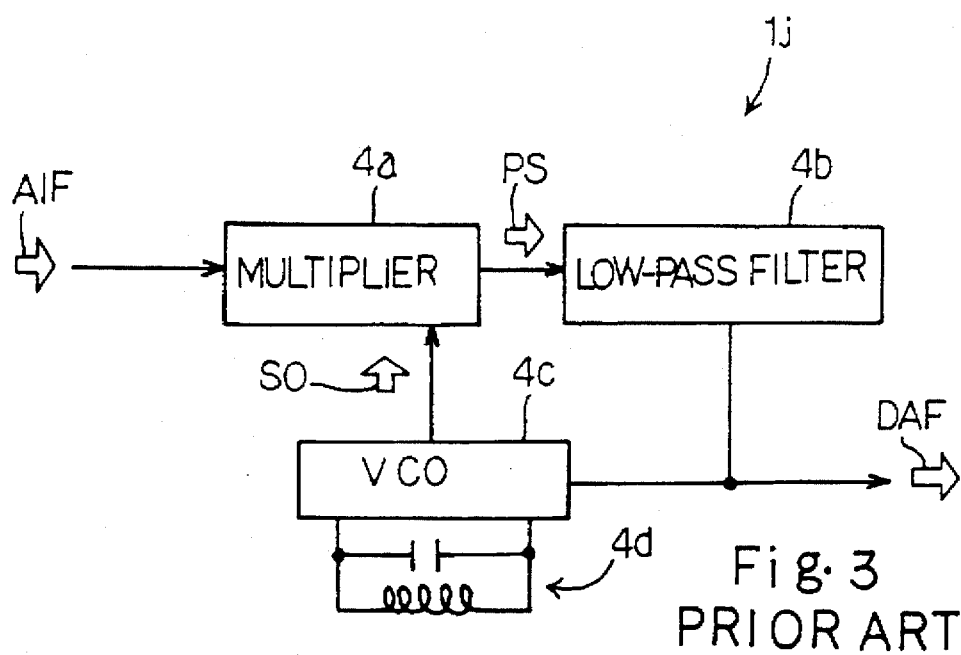
FIG. 3 is a block diagram showing the prior art FM demodulator implemented by the PLL circuit.

The multiplier 10a and the low-pass filter 10b are similar to those of the prior art FM demodulator 1j shown in FIG. 3. A multivibrator is incorporated in the voltage-controlled oscillator 10c, and the multiplier 10a, the low-pass filter 10b and the voltage-controlled oscillator 10c form a phase locked loop 10e.

An audio intermediate frequency signal AIF is supplied from the limiter (not shown) to the multiplier 10a, and the multiplier 10a multiplies the audio intermediate frequency signal AIF by an oscillating signal SO, and an output signal representative of the product is supplied to the low-pass filter 10b. The low-pass filter 10b eliminates high-frequency components from the output signal, and generates a demodulated audio-frequency signal DAF. The demodulated audio-frequency signal DAF is supplied to the voltage-controlled oscillator 10c and the temperature compensating amplifier 10d. The voltage-controlled oscillator 10c is responsive to the demodulated audio-frequency signal, and controls the oscillation signal SO as described hereinlater. The demodulated audio-frequency signal DAF passes through the temperature compensating amplifier 10d and the de-emphasis filter 12, and a temperature compensated audio-frequency signal AF is output from the de-emphasis filter 12.

The temperature compensating amplifier 10d includes an amplifier 10f and reference current generators 10g and 10h, and resistors 10i and 10j are incorporated in the reference current generators 10g and 10h, respectively. The reference current generators 10g and 10h generate reference currents i1 and i2, and both reference currents i1 and i2 flow in parallel from the amplifier 10f and the de-emphasis filter 12 to the reference current generators 10g/10h. The amplifier not only amplifies the demodulated audio-frequency signal DAF but also compensates fluctuation in resistances of component resistors due to a temperature variation. On the other hand, the de-emphasis filter 12 not only carries out the de-emphasis function but also compensates the fluctuation in capacitances of component capacitors due to the temperature variation.

Figure 5:
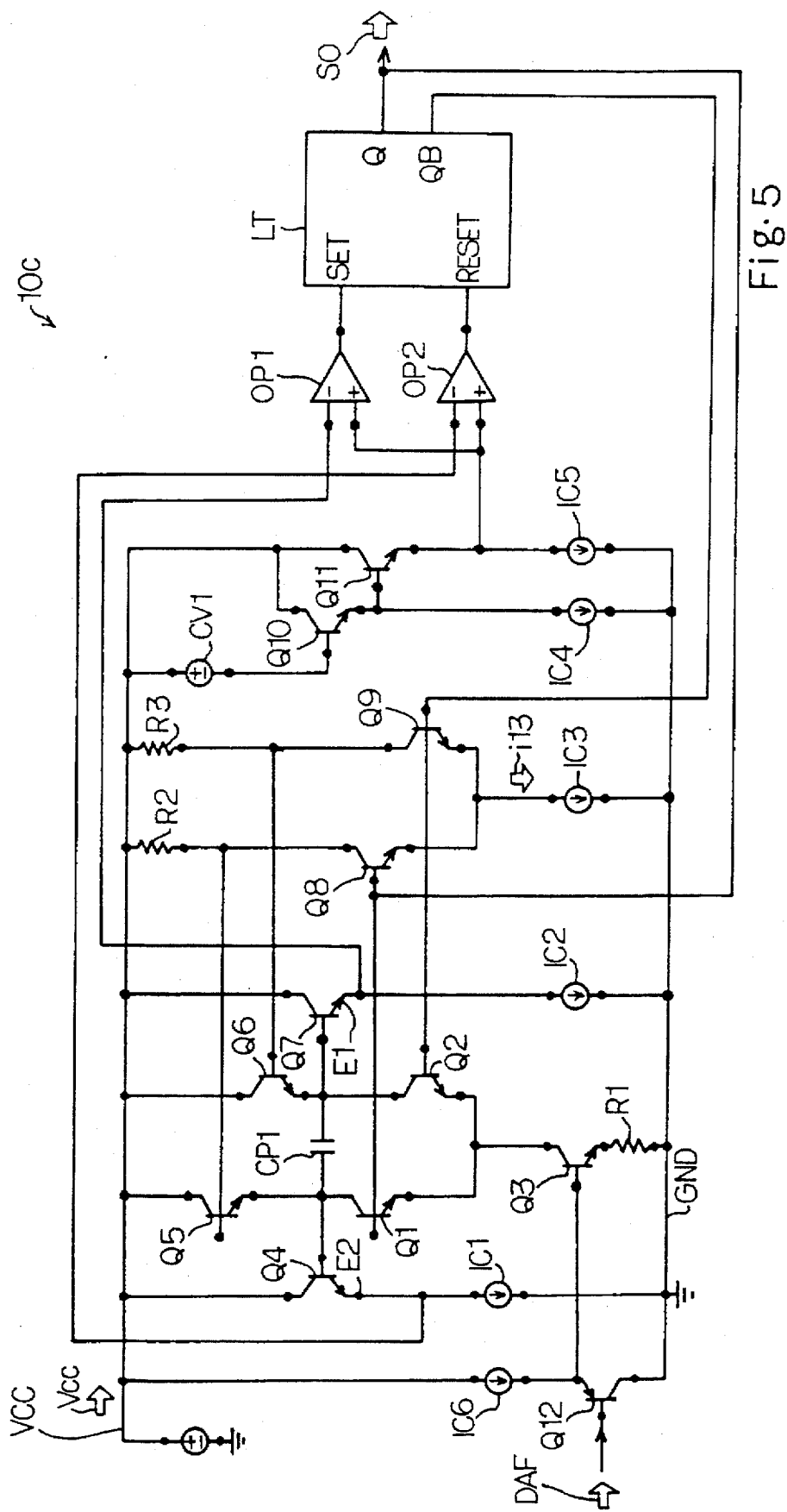
FIG. 5 is a circuit diagram showing the circuit configuration of a voltage-controlled oscillator incorporated in the FM demodulator.

FIG. 5 illustrates the circuit configuration of the voltage-controlled oscillator 10c including an astable multivibrator. Bipolar transistors Q1 to Q12, a constant potential source cv1, a capacitor CP1, resistors R1, R2 and R3, constant current sources IC1 to IC6, operational amplifiers OP1 and OP2 and a latch circuit LT form in combination the voltage-controlled oscillator 10c. The operational amplifier OP1 has an output node connected to the set node of the latch circuit LT, and the output node of the other operational amplifier OP2 is connected to the reset node of the latch circuit LT. A positive power potential Vcc is distributed through a power supply line VCC, and current is discharged to a ground line GND. The constant potential source VC generates a constant potential Vc. The bipolar transistors are assumed to have a emitter-base forward bias voltage Vbe.

Figure 6:
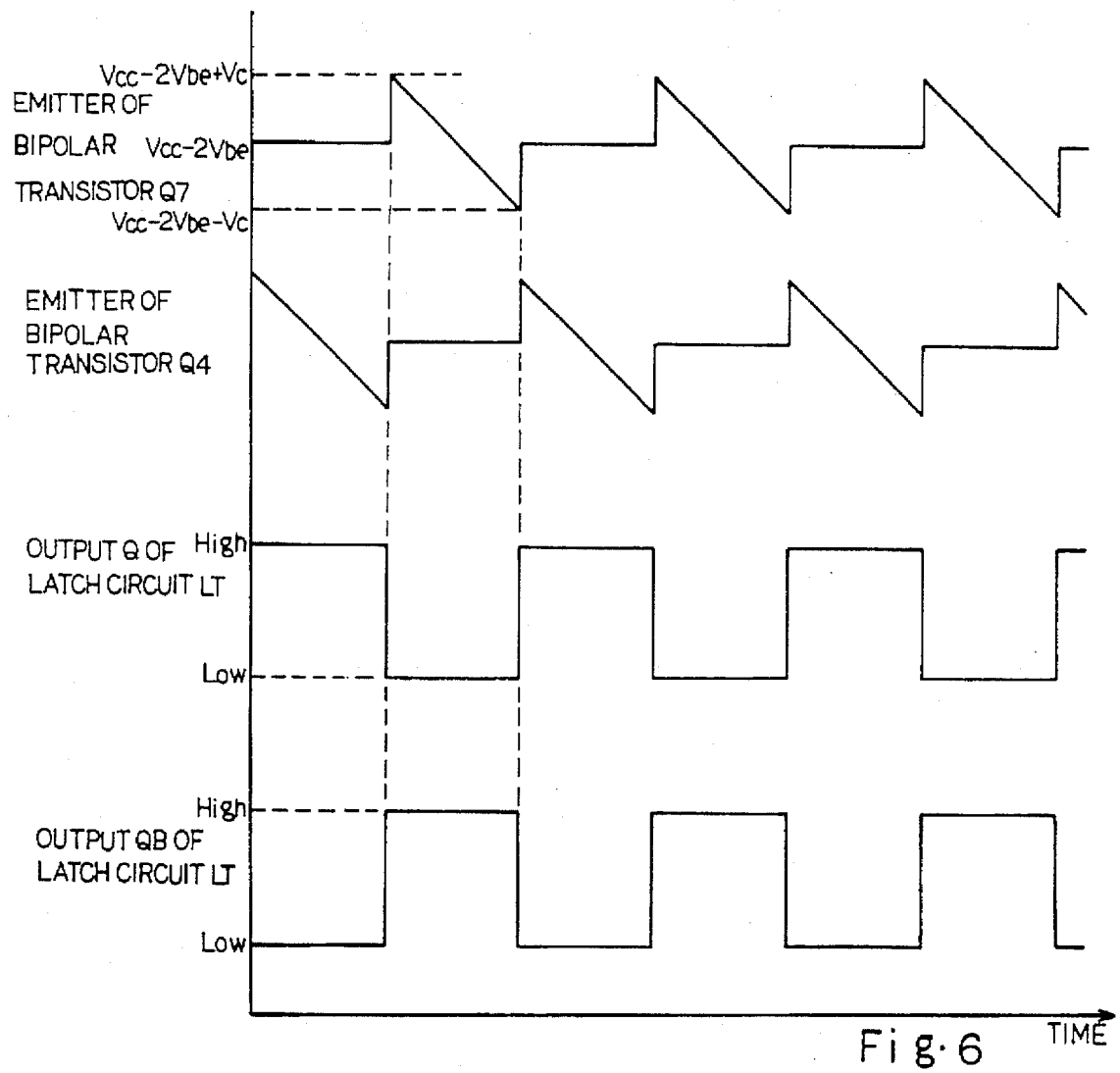
FIG. 6 is a diagram showing potential waveforms at essential nodes of the voltage-controlled oscillator.

The voltage-controlled oscillator 10c behaves as shown in FIG. 6. In the following description, a high potential level and a low potential level are assumed to correspond to logic "1" and logic "0", respectively.

While the latch circuit keeps the output Q in logic "1" and the other output QB in logic "0", the bipolar transistors Q1 and Q8 are turned on, and the bipolar transistors Q2 and Q9 are turned off. The positive power potential Vcc reaches the base node of the bipolar transistor Q6 through the resistor R3, and the bipolar transistor Q6 is turned on. The bipolar transistor Q6 steps down the positive power potential Vcc at the base node to the potential level (Vcc-Vbe) at the emitter node, and the bipolar transistor Q7 steps down the potential level (Vcc-Vbe) at the base node to the potential level (Vcc-2Vbe) at the emitter node. The emitter node of the bipolar transistor Q7 is connected to the inverted node of the operational amplifier OP1, and the potential level (Vcc-2Vbe) is supplied to the inverted node of the operational amplifier OP1. The constant current i13 flows through the resistor R2 and the bipolar transistor Q8 into the constant current source IC3. The potential level at the base node of the bipolar transistor Q5 is lower than the positive power voltage level Vcc by the product between the resistance of the resistor R2 and the current i13, and is smaller than the emitter-base forward bias level Vbe. For this reason, the bipolar transistor Q5 is turned off.

As described hereinbefore, the bipolar transistor Q1 is turned on, and the electric charge accumulated in the capacitor CP1 is discharged as the collector current of the bipolar transistor Q1. As a result, the potential level at the inverted input node of the operational amplifier OP2 is gradually decreased. In this situation, both operational amplifiers OP1 and OP2 produce the output signals of logic "0". However, the output potential of the operational amplifier OP2 is gradually decreased due to the discharge from the capacitor CP1, and the operational amplifier OP2 changes the output from logic "0" to logic "1" when the potential level at the inverted node thereof is lowered below the constant potential level (Vcc-Vc-2Vbe) supplied to the non-inverted node thereof. The output of the operational amplifier OP2 changes the latch circuit LT to the reset state, and the latch circuit changes the potential level at the output node Q to logic "0" and the potential level at the output node QB to logic "1".

The voltage-controlled oscillator 10c repeats the above described function, and generates the oscillating signal SO.

The frequency f of the oscillating signal SO is given by equation 1.

$$f = Vosc/(4 \times C \times Vc \times Ri) \qquad \text{Equation 1}$$

where Vosc is the potential level of the demodulated audio-frequency signal DAF, C is the capacitance of the capacitor CP1, Vc is the constant potential level of the constant potential source CV1 and Ri is the resistance of the resistor R1.

The demodulation sensitivity of the FM demodulator using the voltage-controlled oscillator 10c is through a differentiation for the frequency f as follows. From equation 1, we obtain $$Vosc = 4 \times C \times Vc \times Ri \times f \qquad \text{equation 2}$$

The demodulation sensitivity dVosc/df is given as follows.

$$dVosc/df = 4C\ Vc\ Ri \qquad \text{equation 3}$$

As will be understood from equation 3, the right side of equation 3 contains the terms "Ri" and "C", and the resistance Ri and the capacitance "C" are varied with temperature.

Figure 7:
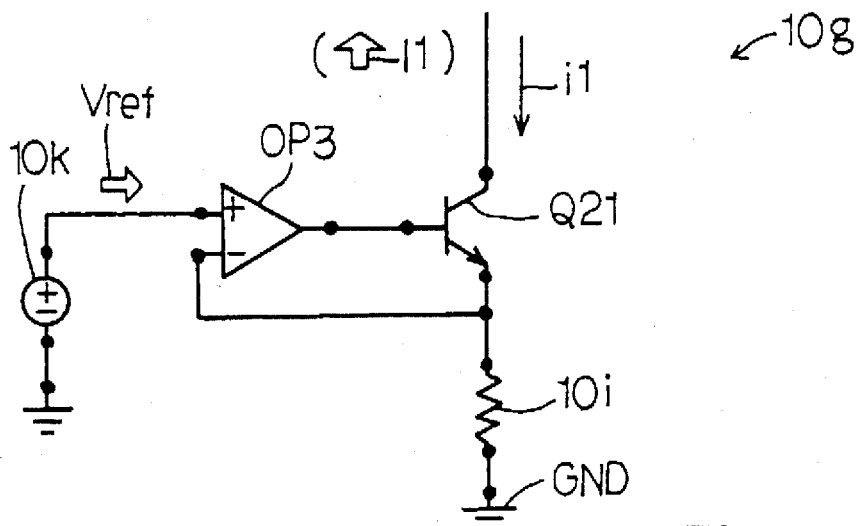
FIG. 7 is a circuit diagram showing the circuit configuration of a reference current generator incorporated in a temperature compensating circuit incorporated in the FM demodulator.
Figure 8:
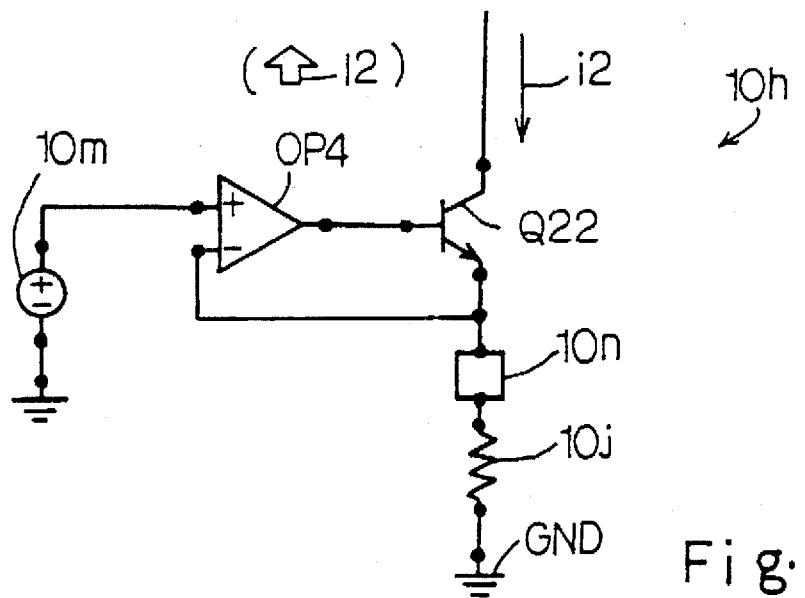
FIG. 8 is a circuit diagram showing the circuit configuration of another reference current generator incorporated in the temperature compensating amplifier.

The reference current generators 10g/10h and the amplifier 10f aim at cancellation of the variation of the resistance Ri and the variation of the capacitance C. FIGS. 7 and 8 illustrate the circuit configurations of the reference current generators 10g/10h.

The reference current generator 10g comprises an operational amplifier OP3, a constant potential source 10k, a bipolar transistor Q21 and the resistor 10i. The constant potential source 10k supplies a reference voltage Vref to the non-inverted input node of the operational amplifier OP3, and the resistor 10i is connected between the emitter node of the bipolar transistor Q21 and the ground line GND. The emitter node is further connected to the inverted input node of the operational amplifier OP3, and the output node of the operational amplifier OP3 is connected to the base node of the bipolar transistor Q21. The operational amplifier OP3 compares the potential level at the emitter node of the bipolar transistor Q21 with the reference potential level Vref, and the bipolar transistor Q21 converts the potential level at the output node of the operational amplifier OP3 to the reference current i1.

The reference current generator 10h comprises an operational amplifier OP4, a constant potential source 10m, a bipolar transistor Q22 and the resistor 10j. The constant potential source 10m supplies the reference voltage Vref to the non-inverted input node of the operational amplifier OP4, and the emitter node of the bipolar transistor Q22 is connected to a pad formed on the semiconductor chip 11. The resistor 10j is connected between the pad 10n and the ground line GND. The emitter node of the bipolar transistor Q22 is further connected to the inverted input node of the operational amplifier OP4, and the output node of the operational amplifier OP4 is connected to the base node of the bipolar transistor Q22. The operational amplifier OP4 compares the potential level at the emitter node of the bipolar transistor Q22 with the reference potential level Vref, and the bipolar transistor Q22 converts the potential level at the output node of the operational amplifier OP4 to the reference current i2.

The resistor 10i is a built-in resistor fabricated on the semiconductor chip 11, and the reference current generator 10g varies the reference current i1 under the temperature condition same as the capacitance C and the resistance Ri. On the other hand, the resistor 10j is not integrated on the semiconductor chip 11, and is a discrete circuit component outside of the semiconductor chip 11. Therefore, the resistor 10j is considered to be free from the temperature variation, and the influence of the temperature variation is quite small on the reference current i2.

The reference currents i1 and i2 are given by equations 4 and 5.

$$i1 = Vref/RRi \quad \text{equation 4}$$

$$i2 = Vref/Rx \quad \text{equation 5}$$

where RRi is the resistance of the built-in resistor 10i and Rx is the resistance of the external resistor 10j. The external resistor 10j makes the capacitance of the internal capacitor have exact quantity.

Figure 9:
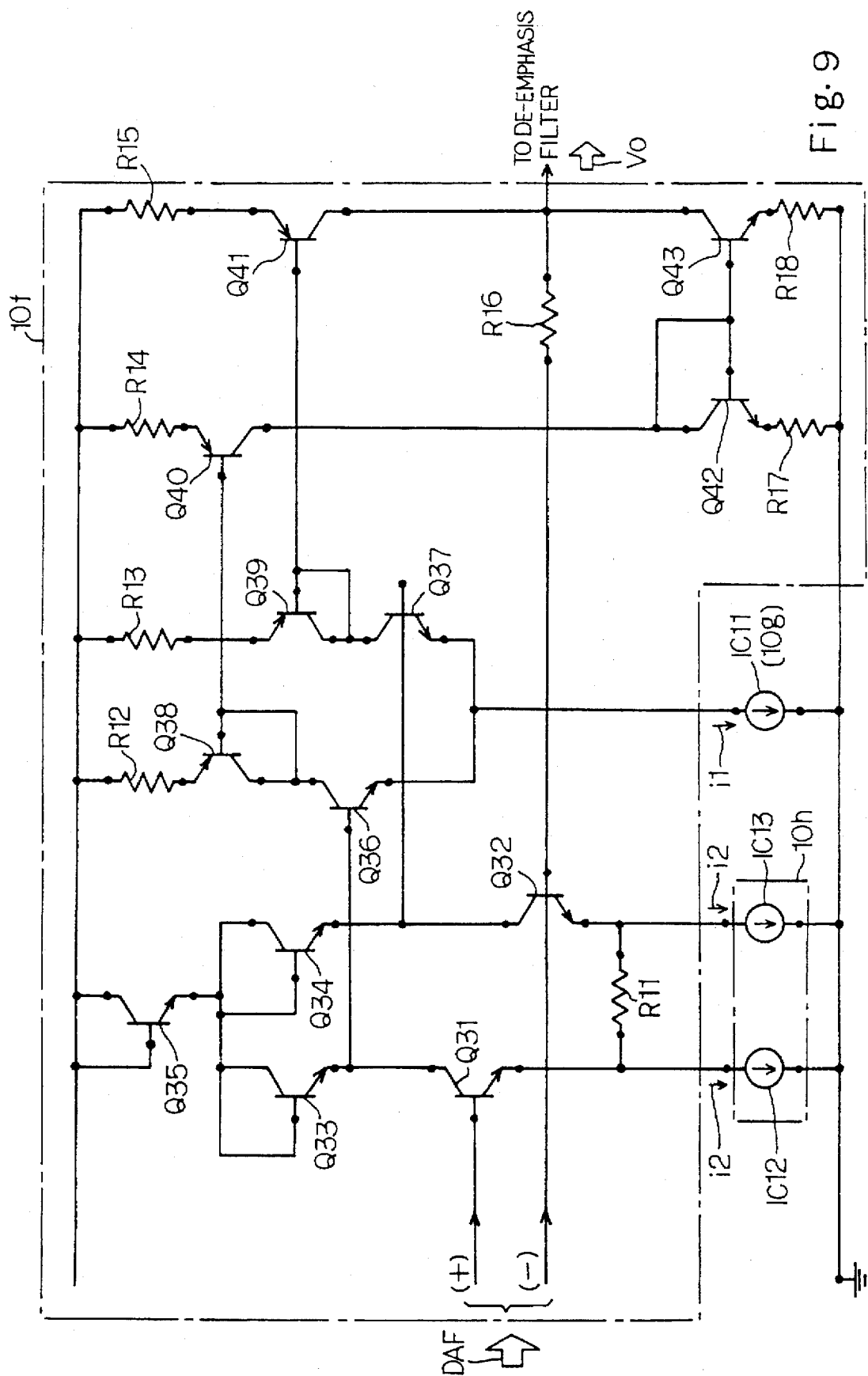
FIG. 9 is a circuit diagram showing the circuit configuration of an amplifier incorporated in the temperature compensating amplifier.

FIG. 9 illustrates an amplifier 10f incorporated in the temperature compensating amplifier 10d. Bipolar transistors Q31 to Q40, bipolar transistors Q41 to Q43 and resistors R11 to R18 as a whole constitute the amplifier 10f. In FIG. 9, the reference current generators 10g and 10h are represented by a constant current source IC11 and constant current sources IC12/IC13, respectively.

The gain Av of the amplifier is given by equation 6.

$$Av = gm \times RL \times i1/(2 \times i2) \quad \text{equation 6}$$

where RL is the resistance of the load resistor R16 and gm is the mutual conductance of the amplifier 10f. The mutual conductance gm is nearly equal to 1/Re where Re is the resistance of the resistor R11.

Equations 4 and 5 are substituted for the currents i1 and i2 in equation 6. We obtain equation 7.

$$Av = gm \times RL \times (Vref/RRi) \times (Rx/2\, Vref) \quad \text{equation 7}$$
$$= gm \times RL \times Rx/(2\, RRi)$$

When demodulated audio frequency signal DAF is supplied to the amplifier 10f, the potential level Vo of the output signal is represented by equation 8.

$$Vo = Av \times 4 \times C \times Vc \times Ri \times \text{delta-}f \quad \text{equation 8}$$
$$= (RL/Re)\{Rx/(2\, RRi)\} \times 4 \times C \times Vc \times Ri \times \text{delta-}f$$

As will be understood from equation 8, the potential level Vo is determined by the ratio of resistance between the internal resistors R11 and R16, the resistance of the external resistor 10j and the constant potential level, which determines the amplitude. The resistances of the internal resistors do not affect the potential level Vo. Even if the temperature changes the resistances of the internal resistors R11 and R16, the ratio is constant, and the potential level Vo is constant against the temperature variation.

Figure 10:
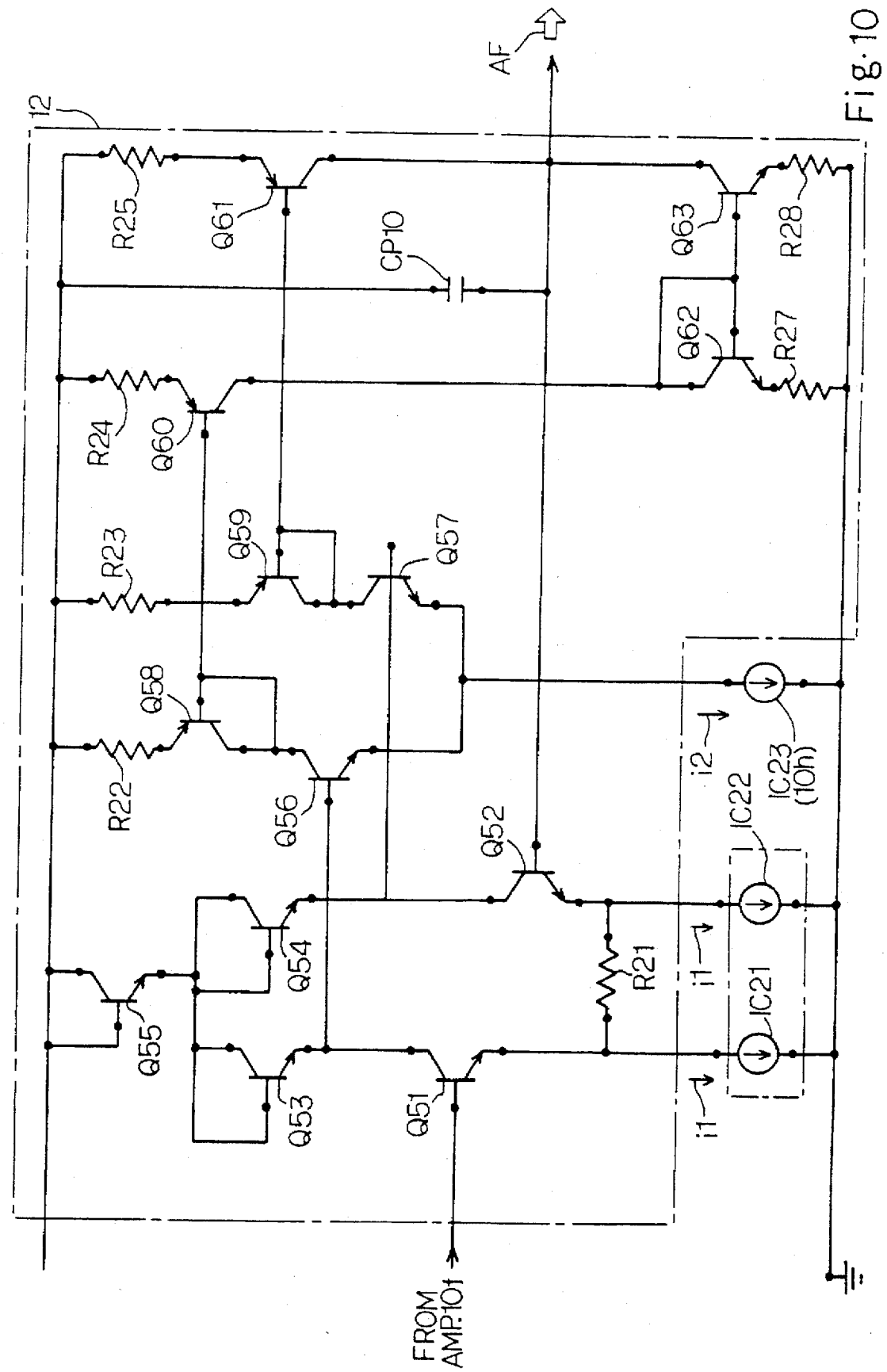
FIG. 10 is a circuit diagram showing the circuit configuration of a de-emphasis filter incorporated in the FM demodulator.

FIG. 10 illustrates the de-emphasis filter 12. The de-emphasis filter 12 includes bipolar transistors 51 to 60, bipolar transistors Q61 to Q63, resistors R21 to R25, resistors R27 and R28 and a load capacitor CP10. The reference current generators 10g and 10h are represented by constant current sources IC21/IC22 and a constant current source IC23, respectively.

Comparing the circuit configuration shown in FIG. 9 with the circuit configuration shown in FIG. 10, the de-emphasis filter 12 is only different from the amplifier 10f in the load capacitor CP10 and the connection to the reference current generators 10g and 10h.

The cut-off frequency fc of the de-emphasis filter 12 is given by equation 9.

$$fc = gm/(2 \times pi \times Cf) \quad \text{equation 9}$$
$$= gm(i2/(2 \times i1))/(2 \times pi \times Cf)$$

where Cf is the capacitance of the load capacitor CP10 and gm is the mutual conductance. The mutual conductance is nearly equal to 1/Re where Re is the resistance of the resistor R21.

Equations 4 and 5 are substituted for the currents i1 and i2 in equation 9. We obtain equation 10.

$$fc = gm(i2/\{2(Vref/RRi)\})/(2 \times pi \times Cf) \quad \text{equation 10}$$
$$= gm\{RRi/(2\, Rx)\}/(2 \times pi \times Cf)$$

When the resistance Rx of the external resistor 10j is appropriately regulated, the cut-of frequency fc becomes constant, and the relation between Rx and Cf is expressed as follows.

$$Rx = gm\{RRi/(2 \times fc)\}/(2 \times pi \times Cf) \quad \text{equation 11}$$
$$= \{RRi/(2 \times fc \times Re)\}/(2 \times pi \times Cf)$$

The potential level Vo of the output signal of the amplifier 10f is given by substituting equation 11 for Rx in equation 8. We obtain.

$$Vo' = Av \times 4 \times C \times Vc \times Ri \times \text{delta-}f \quad \text{equation 12}$$
$$= (RL/Re)\{Rx/(2\, RRi)\} \times 4 \times C \times Vc \times Ri \times \text{delta-}f$$
$$= (RL/Re)[\{RRi/(2\, fc\, Re)\}/(2\, RRi)] \times 4 \times C \times Vc \times Ri \times \text{delta-}f$$

As will be understood from equation 12, the potential level Vo is not dependent on the capacitance of the internal capacitor. Only the ratio of the internal resistor and the capacitor CP10 affects the potential level Vo' of the audio-frequency signal AF. The temperature dependency of the ratio is ignorable. For this reason, if the manufacturer carefully protects the external resistor 10j against the temperature variation, the FM demodulator according to the present invention is free from the temperature variation, and stably generates the audio-frequency signal AF.

As will be appreciated from the foregoing description, the internal resistor 10i on the semiconductor chip 11 and the external resistor 10j form a part of the reference current generator 10g and a part of the reference current generator 10h, respectively, and the reference currents i1 and i2 cause the amplifier 10f and the de-emphasis filter 12 to compensate the amplitude variation of the demodulated audio-frequency signal DAF due to the time constant circuit of the voltage-controlled oscillator 10c under the influence of the temperature variation. Most of the circuit components of the temperature compensating amplifier 10d and the de-emphasis filter are integrated on the semiconductor chip 11, and only the external resistor 10j is implemented by a discrete circuit component. Therefore, the FM demodulator according to the present invention has a decreased production cost.

In the above described embodiment, the capacitor CP1 and the resistor R1 serve as a first capacitor and a first resistor, respectively.

Although particular embodiments of the present invention have been shown and described, it will be obvious to those skilled in the art that various changes and modifications may be made without departing from the spirit and scope of the present invention.

What is claimed is:

1. An FM demodulator connected to a de-emphasis filter supplied with a power current and carrying out a de-emphasis for generating an audio-frequency signal, comprising:

a multiplier for multiplying an audio intermediate frequency signal by an oscillating signal for producing a first output signal representative of a product of the multiplication;

a low-pass filter connected to said multiplier, and eliminating high-frequency components from said first output signal for producing a demodulated audio-frequency signal;

a voltage controlled oscillator connected to said low-pass filter, and responsive to said demodulated audio-frequency signal for controlling a frequency of said oscillating signal, said voltage controlled oscillator having a first resistor and a first capacitor both fabricated on a semiconductor chip and forming parts of a time constant circuit of an astable multivibrator for determining a fundamental frequency of said oscillating signal; and a temperature compensating amplifier connected to said low-pass filter, and amplifying said demodulated audio-frequency signal for generating a second output signal supplied to said de-emphasis filter, said temperature compensating amplifier generating a first reference current passing through a second resistor fabricated on said semiconductor chip and a second reference current passing through a third resistor implemented by a discrete component outside of said semiconductor chip so as to suppress a variation of an amplitude of said demodulated audio-frequency signal due to temperature dependency characteristics of said time constant circuit.

2. The FM demodulator as set forth in claim 1, in which said temperature compensating amplifier includes:

an amplifier fabricated on said semiconductor chip and supplied with said power current for generating said second output signal from said demodulated audio-frequency signal;

a first reference current generator fabricated on said semiconductor chip and having a first node connected to said de-emphasis filter and said amplifier, said second resistor electrically connected to said first node and a second node connected between said second resistor and a constant voltage line for discharging said first reference current; and a second reference current generator fabricated on said semiconductor chip except for said third resistor and having a third node connected to said de-emphasis filter and said amplifier, said third resistor electrically connected to said third node and a fourth node connected between said third resistor and said constant voltage line for discharging said second reference current, said first and second reference currents causing said amplifier and said de-emphasis filter to suppress said variation of said amplitude of said demodulated audio-frequency signal due to a temperature variation.

3. The FM demodulator as set forth in claim 2, in which said first reference current generator further includes a first constant voltage source, a first operational amplifier having a first non-inverted input node connected to said first constant voltage source and a first inverted node, and a first transistor having a control node connected to a first output node of said first operational amplifier, a first current input node connected to said first node and a first current output node connected to said first inverted node and to said second resistor, and said second reference current generator further includes a second constant voltage source, a second operational amplifier having a second non-inverted input node connected to said second constant voltage source and a second inverted node, and a second transistor having a control node connected to a second output node of said second operational amplifier, a second current input node connected to said third node and a second current output node connected directly to said second inverted node and to said third resistor through a pad formed on said semiconductor chip.

* * * * *